United States Patent [19]

Ozmat et al.

[11] Patent Number: 5,195,021
[45] Date of Patent: Mar. 16, 1993

[54] CONSTRAINING CORE FOR SURFACE MOUNT TECHNOLOGY

[75] Inventors: Burhan Ozmat, Dallas; Robert J. Gordon, Coppell, both of Tex.

[73] Assignee: Texas Instruments Incorporated, Dallas, Tex.

[21] Appl. No.: 704,690

[22] Filed: May 17, 1991

Related U.S. Application Data

[63] Continuation of Ser. No. 397,060, Aug. 21, 1989, abandoned.

[51] Int. Cl.⁵ .............................................. H02B 1/00
[52] U.S. Cl. ................................. 361/386; 174/252; 174/255; 361/388; 361/400; 361/412; 361/414; 428/195; 428/285; 257/712
[58] Field of Search ............... 174/250, 252, 253, 255, 174/256, 259, 260, 261; 357/81; 361/386, 387, 388, 392, 393, 397, 400, 404, 412, 414, 416, 417, 419, 420; 428/406, 408, 457, 901, 902

[56] References Cited

U.S. PATENT DOCUMENTS

| | | | |
|---|---|---|---|
| 3,339,269 | 9/1967 | Hanink | 228/219 |
| 3,395,318 | 7/1968 | Laermer et al. | 361/416 |
| 4,591,659 | 5/1986 | Leibowitz | 174/256 |
| 4,700,273 | 10/1987 | Kaufman | 361/421 |
| 4,706,256 | 11/1987 | Sheng et al. | 228/193 |
| 4,711,804 | 12/1987 | Burgess | 361/383 |
| 4,849,858 | 7/1989 | Grapes et al. | 361/388 |
| 4,878,152 | 10/1989 | Sauzade et al. | 361/386 |
| 4,959,900 | 10/1990 | de Givry et al. | 361/388 |
| 4,963,414 | 10/1990 | Le Vasseur et al. | 428/457 |

FOREIGN PATENT DOCUMENTS

| | | | |
|---|---|---|---|
| 2440988 | 3/1975 | Fed. Rep. of Germany | 445/28 |
| 0053256 | 5/1978 | Japan | 357/71 R |
| 0307768 | 12/1988 | Japan | 361/386 |

OTHER PUBLICATIONS

"Handbook of Chemistry and Physics", 28th Ed. 1944 Chemical Rubber Publishing Co.
"The Condensed Chemical Dictionary", 8 Ed. by Gessner G. Hawley, May 1974.

*Primary Examiner*—Leo P. Picard
*Assistant Examiner*—Donald A. Sparks
*Attorney, Agent, or Firm*—Richard L. Donaldson; René E. Grossman

[57] ABSTRACT

A thermal core (10) comprising a graphite layer (12) held between two molybdenum layers (14) for dissipating heat from a plurality of chip carriers 22. Core 10 has the ability to withstand excessive vibrational loads while being light weight. Bonding molybdenum/graphite/molybdenum layers (12, 14) creates a core (10) having an increased stiffness factor which surpasses military vibrational requirements. By using a titanium layer (16) to braze graphite layer (12) and molybdenum layers (14), plating for preventing corrosion attack is not necessary.

37 Claims, 2 Drawing Sheets

CONSTRAINING CORE FOR SURFACE MOUNT TECHNOLOGY

This application is a continuation, of application Ser. No. 07/397,060, filed Aug. 21, 1988 now abandoned.

TECHNICAL FIELD OF THE INVENTION

This invention relates in general to a constraining core for a surface mount used for holding printed wiring boards, and in particular to a layered, low density composite constraining core which functions to dissipate heat from the mounted electronic module and which can prevent electronic components from getting structurally damaged under a wide range of vibration conditions.

BACKGROUND OF THE INVENTION

High density electronic systems, such as the types developed for aerospace and military applications, are normally formed of standard size, two-sided electronic circuit modules typically having twenty-five (25) or more square inches of printed wiring board space on each side. These circuit modules require a combination of mechanical and thermal properties which enable the system to tolerate environmental stresses due to temperature excursions and/or vibration without electronic failures. Differences in material properties among the various components in prior circuit modules can lead to failures during normal operation.

In recent years, the military has been increasing its vibrational loading conditions and lowering the weight requirements for electronic circuit modules. Unfortunately, to withstand environmental stresses and to dissipate power, conventional surface mount technology printed wiring boards have been relying upon a heavy copper layered material which has, because of weight requirements, traditionally experienced structural problems under vibrational test and in the field.

The conventional surface mount technology of printed wiring boards (PWB) uses clad material for the core, such as copper-invar-copper (CIC) or copper-molybdenum-copper (CMC), as the constraining heat sink on high wattage circuit boards. Generally, current available CIC and CMC layered materials have relatively high densities which require the fabrication and use of relatively thin layers of copper in order to meet the weight requirements set by the military. Unfortunately, this thinning of the layers occurs at the expense of a lower resonant vibration frequency which ultimately reduces the stiffness of the board and lowers the cooling capacity.

Because of the reduced thickness of copper in prior devices, there is minimal dissipation of heat from the contacting electronic circuit modules. Further, the difference between the coefficient of thermal expansion (CTE) of the core and the electronic circuit modules is high, since the ratio of the electronic circuit modules volume to the core volume is high due to the thinning of the layers. This overall increase in the difference of the CTE of the components lowers the system's performance and requires the use of leaded ceramic chip carriers which ultimately decreases the available space on the surface of the circuit boards, and limits the performance and power.

To prevent damage of the core, CIC and CMC layers require corrosion protection of the invar and copper constituents. This has been accomplished in the past by plating the CIC or CMC layer with a nickel composition. This plating step, unfortunately, is costly and can be extremely difficult to perform. This is especially true on CMC layers where the nickel must be sintered onto the molybdenum at 850 degrees Centigrade to provide adequate nickel to molybdenum adhesion. However, this temperature of 850 degrees Centigrade is too high for copper and makes it difficult to find and operate in a processing window. Further, the processes that adequately nickel-plate the exposed metal surfaces and CMC layers are not generally compatible with an organic based circuit board because the organic circuit boards cannot tolerate the high temperature of 850 degrees Centigrade during the sintering process. Therefore, the finished surface mount technology PWB contain exposed metal surfaces of CIC and CMC which will create corrosion problems.

To offset the thin nature of prior CIC and CMC layers, the vibration resistance has been increased by incorporating structural stiffeners, such as ribs, to increase the structural rigidity of the module without dramatically increasing the core weight. However, the stiffeners require space on the module for attachment by screws which results in less space for the electronic device placement. The stiffeners further cause the following detrimental effects: increased module fabrication time, added weight associated with the stiffeners, added system costs associated with the fabrication of the stiffeners, and routing problems in design of PWB.

A need has therefore arisen for a lightweight surface mount composite core for printed circuit boards which has a high thermal conductivity associated with the composite core layers. Additionally, there is a need for a composite core which has a coefficient of thermal expansion (CTE) which is approximately the same as that of the electronic components in order to eliminate the CTE mismatch which results in cracking of the solder joints between the electronic components and the core. Finally, there is a need for a lightweight core for holding modules which has a high stiffness associated therewith in order to meet the high vibrational loading standards set by the military.

SUMMARY OF THE INVENTION

An important aspect of the present invention comprises a device for mounting printed wiring boards thereto. Specifically, the present invention comprises a molybdenum coated graphite layer for creating a lightweight core to function as a heat sink for surface mounted printed wiring boards. The present invention comprises a thermal core having a graphite layer held between two layers of molybdenum. Initially, the graphite layer, having a thickness of approximately 0.08 inches and a purity of approximately 99.96%, is bonded to two thin molybdenum layers, each having a thickness of approximately 0.010 inches and a purity of approximately 99.7%. This bond is created by brazing them with a thin layer of titanium, having a thickness of approximately 0.0025 inches and a purity of approximately 98.5%. These layers comprise the thermal core necessary for dissipating the heat from chip carriers mounted to the printed wiring boards.

Once the thermal core has been fabricated, the printed wiring boards are bonded to the thermal core by use of an epoxy glass. Subsequently, the chip carrier, made of a ceramic aluminum oxide, is bonded to the printed wiring boards by use of a solder joint. As can be appreciated, the chip carrier is electrically connected to the thermal core in accordance with the present invention.

In its preferred embodiment, the chip carrier is attached to both sides at opposite ends to generally create a symmetrical, double-sided device. This interconnection helps to eliminate any unwanted warping associated with the board during thermal cycling. Another aspect of the invention is the attachment of a plurality of leadless chip carriers to both sides of the thermal core to reduce the total size of the integrated circuit board.

In its preferred embodiment, the titanium layer is positioned between each layer of molybdenum and graphite for bonding the layers together by a brazing process. In its preferred embodiment, the volume ratio of the molybdenum/graphite/molybdenum is approximately 10/80/10. The present invention is capable of rapidly withdrawing heat from the chip carrier to function as a heat sink for the system. Additionally, the present invention is capable of reducing interfacial stresses because the coefficient of thermal expansion (CTE) of the chip carrier and the thermal core are approximately the same. Finally, the stiffness associated with the thermal core provides sufficient resistance to the board for withstanding excessive vibration.

The present invention presents technical advantages over the conventional composite core because of its ability to withstand high stresses, its ability to expand at the same rate as the ceramic chip carriers, its high heat transfer rate for removing heat from the chip carriers, and its lightweight capabilities which are associated with the graphite material.

BRIEF DESCRIPTION OF THE DRAWINGS

Other aspects of the invention and their advantages will be discerned after studying the Detailed Description in conjunction with the Drawing, in which.

DETAILED DESCRIPTION OF THE INVENTION

Figure 1:
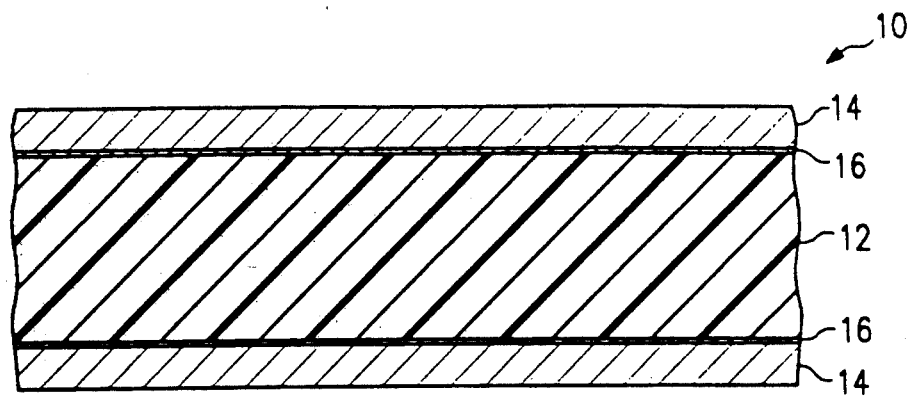
FIG. 1 is an enlarged cross-sectional view of a thermal core according to the present invention.

Referring to FIG. 1, a thermal core of an integrated circuit board is shown in an enlarged cross-sectional view and is generally designated 10. Core 10 generally comprises a graphite layer 12 held between two molybdenum layers 14. Two titanium layers 16 are positioned between layers 14 and layer 12 to bond layers 14 and layer 12 together to form core 10.

Core 10 offers a high performance heat sink material for a surface mounted electronic module. Core 10 offers a material which has a low density, a high thermal conductivity, and a high specific stiffness, while providing the module coefficient of thermal expansion (CTE) control necessary for reliable use with ceramic chip carriers in a thermal stressed environment.

Figure 2:
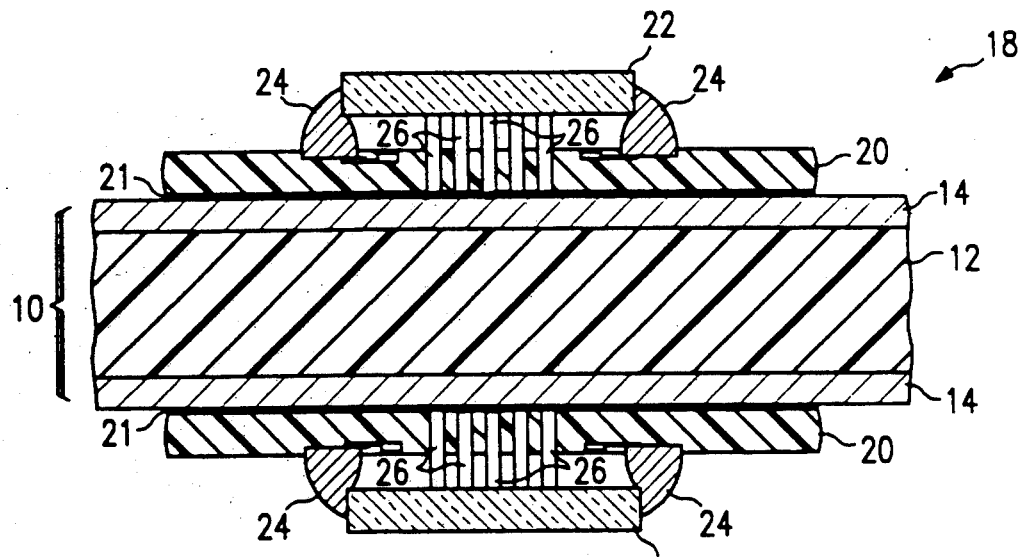
FIG. 2 is an enlarged cross-sectional view of the thermal core connected to a chip carrier in accordance with the present invention.

Referring now to FIG. 2, a preferred embodiment of the core 10 coupled to a chip carrier is generally designated 18. Two printed wiring boards 20 are connected to molybdenum layers 14 by epoxy glass layers 21. In its preferred embodiment, device 18 thus provides a mirror image of printed wiring boards 20. By having two boards 20 connected on both sides of core 10, warping of core 10 in its operation can be prevented.

After printed wiring boards 20 have been connected to core 10, two chip carriers 22 are connected to boards 20 by solder joints 24. Chip carriers 22 are electrically connected to printed wiring boards 20 and core 10 by a plurality of interconnectors 26.

Figure 3:
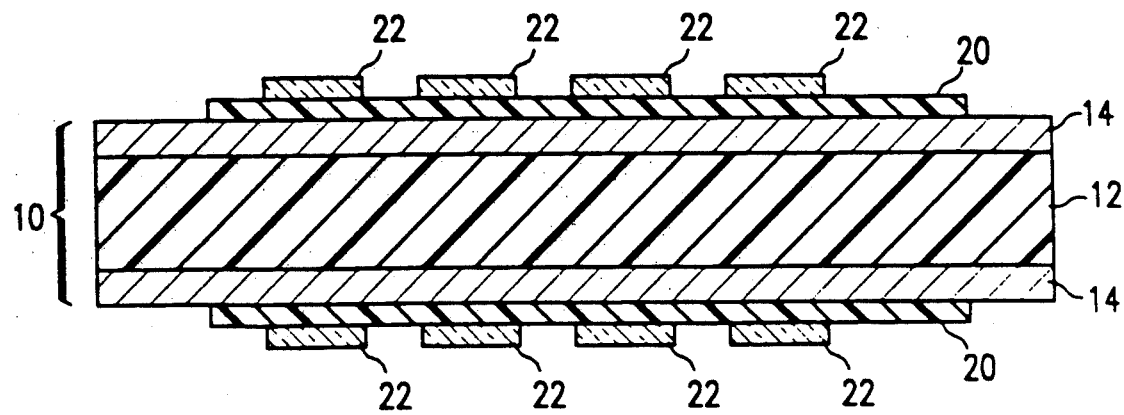
FIG. 3 is an enlarged cross-sectional view of a plurality of chip carriers connected to the thermal core.

FIG. 3 illustrates another embodiment of the present invention wherein a plurality of chip carriers 22 are connected to printed wiring boards 20. This embodiment reduces warping by having the mirror image of chip carriers 22 on opposite sides of the configuration. The mirror image configuration reduces the space necessary to hold a plurality of chip carriers 22, as the carriers are disposed on both sides of the configuration.

In operation, thermal core 10 acts as a heat sink which dissipates heat generated by active electronic devices which are held within chip carriers 22. Additionally, core 10 acts as a substrate for which board 20 and leadless ceramic chip carriers 22 are attached. Due to the nature of the stacking order of graphite layer 12 and molybdenum layers 14, there is an increased stiffness which results in a higher resistance to the vibration loading by reducing the bending displacement of core 10. Consequently, military standards which have been increased through the years are able to be met because of the increased vibrational loading ability of the novel thermal core 10. Accordingly, there is an increased bending stiffness of the electronic modules due to the interactions of layers 12 and 14.

Layers 12 and 14 act as a vibration cushion because of the interactions therebetween. The construction of layers 12 and 14 is very similar to that of an I-beam in the offering of additional stiffness. Increased specific stiffness (the ratio of stiffness to density) results in lower bending amplitudes and subsequent lower strains within solder joints 24. The increase in specific bending stiffness reduces the stresses and strains of solder joints 24, and therefore results in extended lifetime and improved reliability.

Another advantage of the present invention is the ability to design chip carriers 22 and core 10 that have similar coefficients of thermal expansion (CTE). By reducing the CTE mismatch between core 10 and chip carriers 22, the relative thermal displacement between these two components is reduced. Therefore, solder joints 24 tend not to go through high thermal strains which would result in cracking and failure of the components. Accordingly, the heat sink, i.e. core 10, has a high fracture toughness to prevent the brittle failures under test and field conditions. It has been found by utilizing core 10, i.e. molybdenum layers 14 bonded to the polycrystalline graphite layer 12, a heat sink can be offered with desirable CTE control.

External molybdenum layers 14 maximize composite bending stiffness. Generally, graphite layer 12 is relatively brittle when used alone. Fortunately, when molybdenum layers 14 are used in conjunction with graphite layer 12, stresses and strains in graphite layer 12 are significantly reduced. This particular construction results in the stiffness that is beneficial for withstanding excessive vibrational loading in accordance with the present invention.

One result of this unique material combination is a 2.5 to 3 times reduction in the density because of the graphite incorporated between the molybdenum layers 14. Additionally, it has been found that there is a 1.8 to 3.3 times increase in the specific thermal conductivity, resulting in an extremely good heat sink for integrated circuits as compared to CIC and CMC layered cores. Additionally, there is a 2.4 to 3.2 times increase in specific bending stiffness relative to the current technologies available, such as CIC and CMC.

Figure 4:
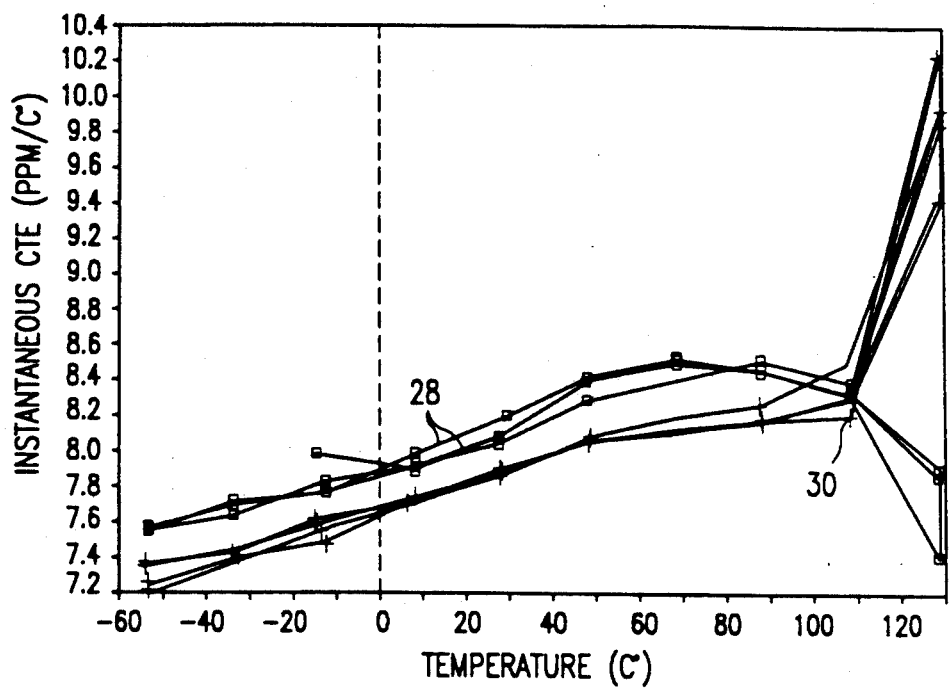
FIG. 4 is a graph illustrating the relationship of the coefficient of thermal expansion with respect to temperature for the present invention.

Referring now to FIG. 4, the interaction of the CTEs, or the coefficients of thermal expansion, can be further appreciated. It can be seen that there is a correlation between the instantaneous CTE in units of parts per million per degrees Centigrade (ppm/° C.) versus the temperature exposure of the particular device in degrees Centigrade. As can be illustrated by a plurality of lines 28, there is a linear relationship between −55° degrees Centigrade and 110 degrees Centigrade. Lines 28 are actual experimental results of the CTE of a plurality of cores 10. As can be seen by point 30, there is a structural change of a particular component material involved within the processing and fabrication of the surface mount module. Specifically, it has been found that there is a glass transition temperature of epoxy at approximately 110 degrees Centigrade which results in the apparent change in the CTE behavior of device 18. This particular interaction may be improved by increasing the glass transition temperature of the epoxy glass used for holding the devices together beyond 125 degrees Centigrade.

Figure 5:
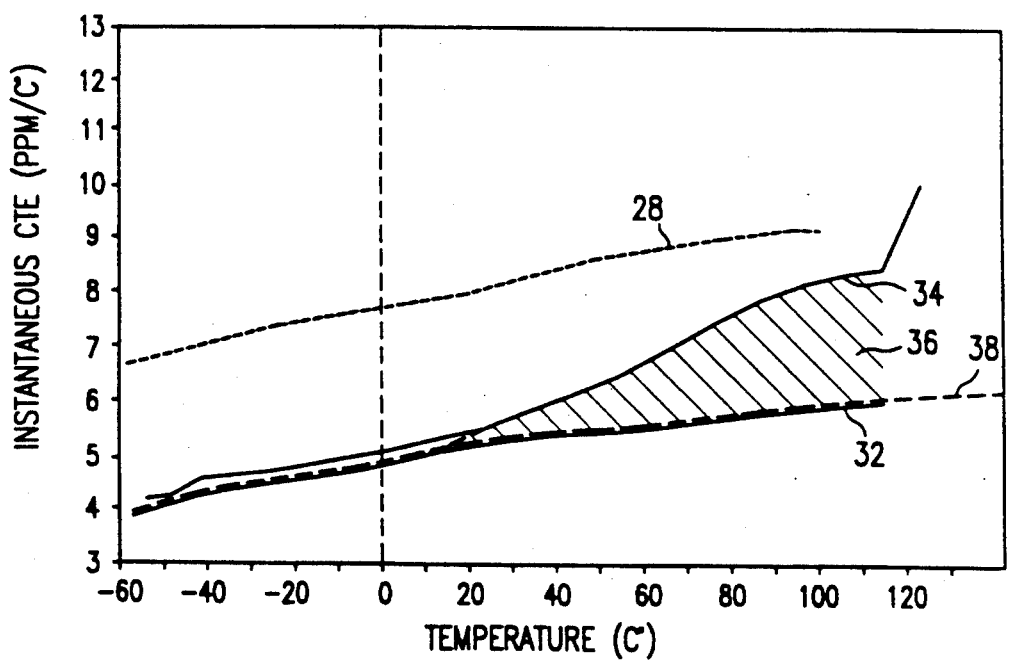
FIG. 5 is a graph illustrating the coefficient of thermal expansion characteristics of the chip carrier, the present invention, and the prior art.

Referring now to FIG. 5, the relationship of the CTE, or the coefficient of thermal expansion, versus the average temperature for chip carrier 22, the present invention, and the prior art is illustrated. Line 32 illustrates the relative linearity of the CTE for chip carrier 22. In comparison, line 34 illustrates the relationship of CTE versus temperature with respect to the current CIC material, or copper-invar-copper. The difference between line 32 and line 34 is shown as area 36.

Based on analysis of FIG. 5, it can be seen that there is a significant difference between the coefficient of the thermal expansion of chip carrier 22 represented by line 32 which is linear and the current CIC technology represented by line 34 which is nonlinear. This difference in CTE values can result in early failure of solder joints 24 when in operation.

In contrast, line 29 is relatively linear and similar to that of line 32. Line 29 represents the average of the plurality of lines 28 as seen in FIG. 4. By adjusting the thickness of molybdenum layers 14 and graphite layer 12, line 29 is adjusted to become line 38. In other words, line 38 can be adjusted to exhibit the characteristics of line 32. Accordingly, when designing core 10 for carrying ceramic chip carriers 22, the CTEs can be designed to be relatively the same. This results in matching thermal expansion coefficients which decreases thermal fatigue failures of solder joint 24 significantly.

FABRICATION

In the preferred embodiment of fabrication, the three layered, laminated thermal core 10 is composed of molybdenum/graphite/molybdenum, having a volume ratio of 10/80/10. The particular layers have a flatness characteristic of approximately 0.002 inch per inch in all dimensions as measured on a graphite flat table four times across the surface. Additionally, the surface finish integrity is measured by a profilometer, which is generally less than 16 microinches rms (0.4 micrometers).

The thermal conductivity of the molybdenum layer 14 is less than approximately 140 W/m/° C., both in thickness direction and within the plane of the sheet. Generally, molybdenum is free of porosity which results in a density minimum of approximately 0.368 pounds per cubic inch. The tensile strength and ductility results in a tensile stress of the molybdenum layer 14 of an approximate minimum of 50 Ksi. Because of the matched CTE of molybdenum layer 14 and carrier chip 22, the coefficient of thermal expansion, or the CTE, of core 10 is on average, approximately 5±0.5 ppm/degrees Centigrade within the temperature range of approximately −65 degrees Centigrade to approximately 125 degrees Centigrade. The purity is an important element of the molybdenum based upon the interactions of the compound. The best results are obtained when using approximately 99.7 percent pure molybdenum metal. This purity is based on inductively coupled plasma spectraphotometry (ICPS).

In its preferred embodiment, the thickness of the molybdenum sheet is approximately 0.010 inches ±0.0005 inches. Consequently, the final size, based on the preferred ratio of 10/80/10 of the total thickness of core 10, has a final thickness of molybdenum-graphite-molybdenum between approximately 0.05 inches and approximately 0.1 inches.

With respect to graphite layer 12, the thermal conductivity is less than approximately 140 W/m/° C. both in thickness direction and within the plane of the layer. This standard is based upon the measure of the ASTM C-647. The density of the graphite is approximately 0.065 pounds per cubic inch. This particular material has a tensile strength of graphite sheets which is approximately 20 Mpa minimum. Consequently, the thermal expansion coefficient of the graphite, which is very similar to that of molybdenum layer 14, is approximately 5.0±1.0 ppm per degrees Centigrade within the temperature range of approximately −65 degrees Centigrade to approximately 125 degrees Centigrade. The thickness of layer 12, in its preferred embodiment, is approximately 0.08 inches.

With respect to the filler material, i.e., titanium layer 16, it is important that there be a purity of approximately 98.5 percent. This purity allows for the reduction of corrosion or corrosion creating elements. The thickness of titanium layer 16 is approximately 0.0025 inches±0.0008 inches. The brazing of molybdenum layer 14 to graphite layer 12 is done by methods well known in the art. The brazing alloy must be one which will not seriously degrade the thermal properties or erode under module environmental conditions. In general, the braze thickness must be kept thin, i.e. 4 percent of the overall thickness, and the braze alloy should comprise noncorroding brazes such as titanium, but may also include zirconium. In operation, the temperature is increased to approximately 1700 degrees Centigrade in a vacuum chamber to melt the titanium layer 16 to bond layers 14 and layer 12 together.

An alternative embodiment of the present invention includes graphite layer 12 having a thickness between approximately 0.005 inches and approximately 0.100 inches. Additionally, molybdenum layers 14 have a thickness between approximately 0.002 inches and approximately 0.05 inches. Finally, titanium layers 16 have a thickness between approximately 0.001 inches and approximately 0.01 inches.

The present invention is applicable for several technologies, such as space. Specifically, instead of using pure molybdenum mirrors as currently used in space, the low expansion mirrors having a graphite embedded therebetween can be utilized, which decreases the total weight. Additionally, heat sink core 10 may not necessarily be used as a heat sink device, but for other devices such as the outer core of automobiles and aircrafts due to its light weight and structural stability.

In summary, an advantageous, lightweight, controllable thermal expansion coefficient material having a high heat transfer coefficient has been disclosed which features the use of a graphite layer embodied between two molybdenum layers for adding to the stiffness of the graphite to reduce its brittle nature. It has been found that the high specific stiffness of the particular layer device is able to withstand great vibrational stresses and is able to surpass the requirements by the military. Additionally, because of its lightweight nature, there is the potential for reduced costs. Also, there is the added advantage of eliminating the required nickel plating necessary to protect such embodiments from corrosion.

While preferred embodiments of the invention and their advantages have been disclosed in the above detailed description, the invention is not limited thereto, but only by the spirit and scope of the appended claims.

What is claimed is:

1. A composite core, comprising:
   (a) a graphite layer;
   (b) a layer of material disposed on each opposing side of said graphite layer having approximately the same coefficient of thermal expansion as said graphite layer and greater stiffness than said graphite layer; and
   (c) a bonding layer positioned between each of said layers of material and said graphite layer bonding said layers of material and said graphite layer together to form an integral composite core.

2. A composite core, comprising:
   (a) a graphite layer;
   (b) layers of material disposed on opposite sides of said graphite layer having approximately the same coefficient of thermal expansion as said graphite layer and greater stiffness than said graphite layer; and
   (c) a bonding layer positioned between each of said layers of material and said graphite layer for bonding said layers of material and said graphite layer together to form an integral composite core;
   (d) wherein said layers of material are molybdenum.

3. The core as recited in claim 2, wherein the volume ratio of said molybdenum/graphite/molybdenum layers is 10/80/10.

4. The core as recited in claim 2, further comprising a printed wiring board coupled to the exposed molybdenum layer surfaces.

5. The core as recited in clam 4, further comprising a chip carrier bonded to said printed wiring board.

6. The core as recited in claim 5, wherein said chip carrier has an interconnector for connecting said chip carrier to the core.

7. A composite material, comprising:
   (a) a graphite layer;
   (b) low expansion, high modulus, high thermal conductivity sheets disposed on opposite sides of said graphite layer; and
   (c) a bonding layer formed between each said sheet and said graphite layer for bonding said sheets and said layers to form an integral composite material;
   (d) wherein said low expansion, high modulus, high thermal conductivity sheets comprise molybdenum.

8. The core as recited in claim 2, wherein the molybdenum layer has a thermal conductivity of approximately 140/W/m/° C.

9. The core as recited in claim 2, wherein said graphite layer has a thermal conductivity of approximately 140 /W/m/° C.

10. The core as recited in claim 2, wherein the core thickness ranges between approximately 0.05 inches and approximately 0.1 inches.

11. The core as recited in claim 2, wherein said titanium layer is used as a brazing material for interconnecting said molybdenum layers and said graphite layer.

12. The core as recited in claim 11, wherein said titanium brazing causes the tensile and shear stress of the braze interface to be equal or better than the tensile or shear stress of said graphite layer.

13. A composite core comprising:
   a graphite layer having a thickness between approximately 0.005 inches and approximately 0.100 inches;
   two molybdenum layers each having a thickness between approximately 0.002 inches and approximately 0.05 inches for holding said graphite layer therebetween; and
   a titanium layer having a thickness between approximately 0.001 inches and approximately 0.01 inches positioned between each said molybdenum layer and said graphite layer for bonding said layers together to create core, said titanium layer being heated to braze said molybdenum and said graphite layers together to form an integral composite core.

14. The core as recited in claim 13, wherein the average coefficient of thermal expansion of said graphite layer is approximately 5.0±1.0 ppm/° C. within the temperature range of between approximately −65° degrees Centigrade and ±125° degrees Centigrade.

15. The core as recited in claim 13, wherein said coefficient of thermal expansion of said molybdenum layer is approximately 5±0.5 ppm/° C. within the temperature range of approximately −65° degrees Centigrade to approximately 125° degrees Centigrade.

16. The core as recited in claim 13, wherein the brazing bond between said molybdenum layer and said graphite layer created by said titanium layer creates a tensile stress of the brazed interface which is equal or better than the graphite tensile stress.

17. The core as recited in claim 13, wherein said titanium layer has a thermal conductivity of approximately 90 W/m/° C.

18. An electronic system, comprising:
   a graphite layer;
   molybdenum layers bonded to each side of said graphite layer for creating a thermal core;
   a printing wiring board coupled to each exposed molybdenum layer surface; and
   a chip carrier bonded to said board, said chip carrier having an interconnector for connecting said chip carrier to the thermal core.

19. The system as recited in claim 18, wherein said chip carrier and said thermal core have approximately the same coefficient of thermal expansion.

20. The system as recited in claim 18, wherein said thermal core functions as a heat sink for the printed wire board by readily dissipating heat from said printed wire board to the thermal core.

21. A process for manufacturing a composite core comprising the steps of:
 connecting surfaces of a graphite layer to layers of titanium;
 applying a layer of molybdenum; and
 heating said layers until said titanium layer melts to bond said graphite and said molybdenum layer together.

22. The process as recited in claim 21, wherein said step of heating causes the layers to braze together.

23. The process as recited in claim 21, wherein said heating step comprises applying approximately 1700° degrees Centigrade in a vacuum.

24. A process for preparing a constraining thermal core for a surface mount comprising the steps of:
 bonding a layer of graphite between two layers of molybdenum;
 connecting a printed wire board to a side of said molybdenum layers;
 joining a chip carrier to said printed wire board; and
 electrically connecting said chip carrier to said molybdenum for permitting heat to flow from said chip carrier to said molybdenum and said graphite layer to dissipate said heat from said chip carrier.

25. The process as recited in claim 24, wherein said coefficient of thermal expansion of said chip carrier and said molybdenum and graphite layers are approximately the same.

26. The core as recited in claim 7, wherein said bonding layer is a titanium layer and has a purity of approximately 98.5%.

27. A process for manufacturing a composite material comprising the steps of:
 connecting surfaces of a graphite layer to bonding layers;
 applying a layer of molybdenum to each said bonding layer; and
 heating said layers until said bonding layers melt to bond said graphite and said molybdenum layers together.

28. The process as recited in claim 27, wherein bonding layer comprises titanium.

29. The process as recited in claim 27, wherein said step of heating causes the layers to braze together.

30. The process as recited in claim 27, wherein said step of heating comprises applying approximately 1700° C. to said layers in a vacuum.

31. The core as recited in claim 1, wherein said bonding layer comprises titanium.

32. A core as set forth in claim 1 wherein the average coefficient of thermal expansion of said graphite layer is approximately from 4.0 to 6.0 ppm/° C. within the temperature range of between approximately −65° C. and 125° C.

33. A core as set forth in claim 1 wherein said coefficient of thermal expansion of said molybdenum layer is approximately 4.5 to 5.5 ppm/° C. within the temperature range of approximately −65° C. to approximately 125° C.

34. A core as set forth in claim 32 wherein said coefficient of thermal expansion of said molybdenum layer is approximately 4.5 to 5.5 ppm/° C. within the temperature range of approximately −65° C. to approximately 125° C.

35. A core as set forth in claim 2 wherein the average coefficient of thermal expansion of said graphite layer is approximately from 4.0 to 6.0 ppm/° C. within the temperature range of between approximately −65° C. and 125° C.

36. A core as set forth in claim 2 wherein said coefficient of thermal expansion of said molybdenum layer is approximately 4.5 to 5.5 ppm/° C. within the temperature range of approximately −65° C. to approximately 125° C.

37. A core as set forth in claim 35 wherein said coefficient of thermal expansion of said molybdenum layer is approximately 4.5 to 5.5 ppm/° C. within the temperature range of approximately −65° C. to approximately 125° C.

* * * * *